(12) United States Patent
Shimoe

(10) Patent No.: US 6,437,439 B1
(45) Date of Patent: Aug. 20, 2002

(54) ELECTRONIC COMPONENT

(75) Inventor: Kazunobu Shimoe, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/532,188

(22) Filed: Mar. 21, 2000

(30) Foreign Application Priority Data

Apr. 1, 1999 (JP) ............................................. 11-095000

(51) Int. Cl.[7] .......................... H01L 23/48; H01L 23/52; H01L 29/40
(52) U.S. Cl. ........................ 257/734; 257/737; 257/778; 257/784; 438/611; 438/612
(58) Field of Search ................................. 257/737, 738, 257/778, 775, 786, 728, 698, 703, 704, 710, 711, 773, 772, 779, 784, 734; 438/611, 612

(56) References Cited

U.S. PATENT DOCUMENTS

| | | | | |
|---|---|---|---|---|
| 5,214,308 A | * | 5/1993 | Nishiguchi et al. | 257/692 |
| 5,598,036 A | * | 1/1997 | Ho | 257/738 |
| 5,629,566 A | * | 5/1997 | Doi et al. | 257/789 |
| 5,633,535 A | * | 5/1997 | Chao et al. | 257/778 |
| 5,672,542 A | * | 9/1997 | Schwiebert et al. | 437/183 |
| 5,798,567 A | * | 8/1998 | Kelly et al. | 257/723 |
| 5,805,422 A | * | 9/1998 | Otake et al. | 361/749 |
| 5,838,069 A | * | 11/1998 | Itai et al. | 257/766 |

FOREIGN PATENT DOCUMENTS

| | | |
|---|---|---|
| JP | 7-99420 | 4/1995 |
| JP | 8-330880 | 12/1996 |
| JP | 9-102497 | 4/1997 |
| JP | 10-98352 | 4/1998 |
| JP | 10-173468 | 6/1998 |
| JP | 10-247700 | 9/1998 |

* cited by examiner

*Primary Examiner*—Elvin Enad
*Assistant Examiner*—Kyung S. Lee
(74) *Attorney, Agent, or Firm*—Keating & Bennett, LLP

(57) ABSTRACT

An electronic component includes an electronic component element electrically and mechanically joined to a base member, a plurality of electrode pads of the electronic component element and corresponding electrode lands of the base member being respectively joined together via bumps such that the electronic component element is arranged opposite to the base member. The bumps located along the peripheral portion of the electronic component element have a greater height than that of the bumps located at the central portion of the electronic component element.

16 Claims, 4 Drawing Sheets

ELECTRONIC COMPONENT

BACKGROUND OF THE INVENTION

1. Field of the Invention

The present invention relates to an electronic component in which an electronic component element, such as a surface acoustic wave element or a semiconductor element, is electrically and mechanically joined to a base member via bump bonding.

2. Description of the Related Art

As electronic components in which electronic component elements are mounted on base members by bump bonding, a surface acoustic wave device has been known, for example, which has the structure shown in FIG. 8. In this surface acoustic wave device, a surface acoustic wave element 20 is electrically and mechanically bonded to a base member 10. While a propagation surface of the surface acoustic wave element 20 is opposed to the base member 10, input/output electrode pads 25a and 25b and an electrode pad for grounding 25c of the surface acoustic wave element 20 are respectively joined to corresponding input/output electrode pads 12a and 12b and an grounding electrode pad 12c of the base member 10 via bumps 51a to 51c which are formed of a material such as Au. Each of the bumps 51a to 51c is formed to have the same height. Then, a cap member 30 is joined to the base member 10 so as to cover the surface acoustic wave element 20, so that the surface acoustic wave element 20 is hermetically sealed within a package defined by the base member 10 and the cap member 30.

However, in a conventional surface acoustic wave device, when a mechanical stress such as an impact caused by dropping the device or a thermal stress such as variation in ambient temperature is applied thereto, mechanical damages such as fracture and exfoliation are produced in bumps 51a and 51b and electrode pads 25a and 25b which are respectively bump-bonded thereto. Such mechanical damage usually occurs in a peripheral portion of the base member 10 and the surface acoustic wave element 20, and the failure in the bump bonding process causes the electronic device to have faulty characteristics. This is because the damage caused by the mechanical stress or the thermal stress is often concentrated on bumps located along a peripheral portion instead of bumps located at the central portion.

SUMMARY OF THE INVENTION

In order to overcome the problems described above, preferred embodiments of the present invention provide an electronic component wave device which achieves a high degree of reliability and prevents problems and faulty connections conventionally occurring during bump bonding by relieving the stress applied to the bumps located along a peripheral portion of a base member and an electronic component element.

According to a preferred embodiment of the present invention, an electronic component includes a base member having a plurality of electrode lands, an electronic component element having a plurality of electrode pads and being electrically and mechanically joined to the base member, a plurality of bumps located between the electronic component element and the base member, the plurality of electrode pads of the electronic component element and the corresponding electrode lands of the base member being respectively joined together via the bumps such that the electronic component is opposite to the base member, wherein the bumps located at the peripheral portion of the electronic component element have a greater height than that of the bumps located in the central portion of the electronic component element.

As a result of this unique structure, the stress applied to the bumps located at the peripheral portion is relieved because the bumps located at the peripheral portion, in which the stress is prone to concentrate, have a greater height than that of the bumps located in the central portion. Consequently, bonding problems such as damage to electrodes or bump bonding portions and exfoliation are reliably prevented, resulting in improved reliability of the electronic component.

In order to obtain bumps having a greater height at the peripheral portion than that of the bumps located at the central portion, various methods such as changing the film thickness of electrode lands formed on the base member; forming the base member to have a convex shape; forming the base member to have a curved shape; or changing the film thickness of electrode pads of the surface acoustic wave element, may be used. Also, any combination of these methods may also be used.

In the above-mentioned configuration, it is preferable that the differences between heights of the bumps are about 1 $\mu$m to about 10 $\mu$m.

In addition, preferred embodiments of the present invention provide an electronic component in which a surface acoustic wave element or a semiconductive element, or other suitable electronic component element, is electrically and mechanically joined to a base member via bump bonding.

According to preferred embodiments of the present invention, the bumps located at the peripheral portion, in which the stress is prone to concentrate, have a greater height than that of the bumps located at the central portion so as to relieve the stress applied to the bumps located at the peripheral portion, so that bonding problems such as damage to electrodes located at bumps or bump bonding portions and exfoliation are reliably prevented.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

An electronic component according to one preferred embodiment of the present invention will be described below in the context of a surface acoustic wave device. However, other electronic component elements may also be included in other types of electronic components of the present invention.

Figure 1:
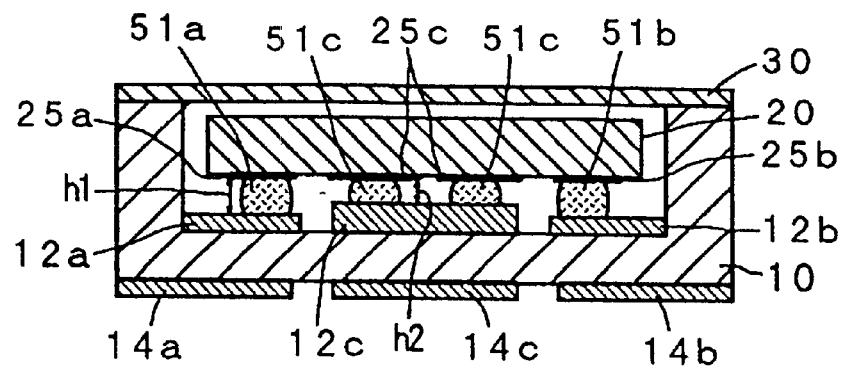
FIG. 1 is a sectional view of a surface acoustic wave device according to a first preferred embodiment of the present invention.
Figure 2:
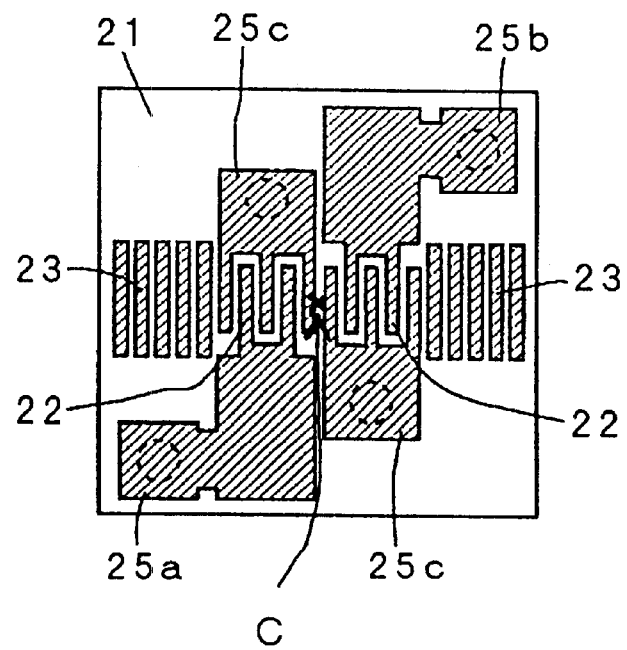
FIG. 2 is a plan view of a surface acoustic wave element according to the first preferred embodiment of the present invention.

A structure of a surface acoustic wave device according to a first preferred embodiment of the present invention is shown in FIGS. 1 and 2. FIG. 1 is a sectional view of the surface acoustic wave device while FIG. 2 is a plan view of a surface acoustic wave element.

In the surface acoustic wave device according to the present preferred embodiment, a plurality of electrode pads 25a to 25c of a surface acoustic wave element 20 and a plurality of electrode lands 12a to 12c on the top surface within a recessed area of a base member 10 are respectively bump-bonded together via bumps 51a to 51c and a cap member 30 is joined to the base member 10 so as to cover the surface acoustic wave element 20, so that the surface acoustic wave element 20 is hermetically sealed within a package (within a space) defined by the base member 10 and the cap member 30.

The base member 10 preferably has a recessed shape and is preferably formed by stacking a plurality of layers of ceramic material or other suitable material. On the top surface of the recessed area, which is a mounting surface of the surface acoustic wave element, an electrode pattern including electrode lands for input-output 12a and 12b and an electrode land for grounding 12c is provided. On the bottom surface of the base member 10, terminal electrodes for input-output 14a and 14b and a terminal electrode for grounding 14c are provided. The electrode lands 12a to 12c are preferably made of thick film electrodes of W or Mo, or other suitable material, with Ni or Au preferably being plated thereon. The electrode lands 12a, 12b, and 12c are respectively connected to terminal electrodes 14a, 14b, and 14c via through-hole electrodes or edge electrodes (not shown). This surface acoustic wave device is mounted on a mounting substrate (circuit board) using the bottom surface of the base member 10 as a mounting surface.

The surface acoustic wave element 20 preferably includes a piezoelectric substrate 21, for example, as shown in FIG. 2. On the top surface of the piezoelectric substrate 21, an electrode pattern including IDT electrodes 22, reflector electrodes 23, and electrode pads 25a to 25c connected to each of the IDT electrodes 22, are provided. The electrode pattern is preferably made of Al or an alloy including Al and formed by a known thin film forming method. In addition, in FIG. 2, portions indicated by circles with broken lines indicate locations of bump bonding portions. The piezoelectric substrate 21 is preferably made of a piezoelectric material such as lithium tantalate, lithium niobate, and crystal or other suitable material.

The surface acoustic wave element 20 is electrically and mechanically joined to a base member 10 in a face-down configuration, that is, the propagation surface of the surface acoustic wave device on which the IDT electrodes 22, and other elements, are provided is opposed to the element-mounting surface of the base member 10. The electrode pads 25a, 25b, and 25c are respectively joined to corresponding electrode pads 12 of the base member 10 via respective bumps 51a, 51b, and 51c. This bonding is performed by applying heat or simultaneously applying heat and ultrasonic waves to fuse bumps 51a to 51c. The bumps 51 to 51c are preferably made of Au or a metal including Au as the principal ingredient. The bumps 51 to 51c are preferably provided on the electrode pads 25a to 25c of the surface acoustic wave element 20 in advance by a ball bonding method. In addition, solder may be used to form the bump, which may be formed on the electrode land of the base member by a method such as printing.

An appropriate metallic material such as an alloy including Fe—Ni is preferably used to form the cap member 30, which may be plated thereon as desired. The cap member 30 is joined to the base member 10 so as to cover the surface acoustic wave element 20, via a soldering material such as solder having a high melting point, an alloy of Au—Sn, or glass having a low melting point or other suitable material.

In the surface acoustic wave device according to the present preferred embodiment, the film of the electrode land for grounding 12c located at an approximately central portion of the base member 10 has a greater thickness than that of the electrode lands for input-output 12a and 12b located along the peripheral portion. That is, the top surface of the electrode land for grounding 12c is higher than the electrode lands for input-output 12a and 12b. Thereby, the bumps 51a and 51b located at the peripheral portion of the surface acoustic wave element 20 have a greater height "h1" than a height "h2" of the bumps 51c located at the central portion of the surface acoustic wave element 20. In order to increase the film thickness of the electrode land for grounding 12c, the electrode film preferably made of W or Mo, or Ni or Au plating has a thickness that is greater than that of the electrode lands for input-output 12a and 12b.

It is to be noted that the bumps "in the central portion" and the bumps "in the peripheral portion" are referred to in terms of the distances from the approximate center of the surface acoustic wave element 20. More specifically, as shown in FIG. 2, the distance between the circles on the electrode pads 25c which indicate the position of the bumps 51c and the approximate center "C" of the surface acoustic wave element 20 are smaller than the distance between the circles on the electrode pads 25a and 25b which indicate the position of the bumps 51a and 51b and the center "C". That is, the bumps 51a and 51b are located father than the bumps 51c from the approximate center of the surface acoustic wave element.

Because of this unique structure and arrangement, when mechanical or thermal stress is applied, the stress applied to the bumps 51a and 51b located along the peripheral portion, in which the stress is apt to concentrate, is relieved, so that mechanical damage such as fracture and exfoliation are prevented from occurring in the bumps and the electrode pads bump-bonded thereto. Therefore, with this preferred embodiment, faulty joining such as breaking of wire in the bump and faulty bump bonding are reliably prevented, resulting in greatly improved reliability of the electronic component.

Figure 3:
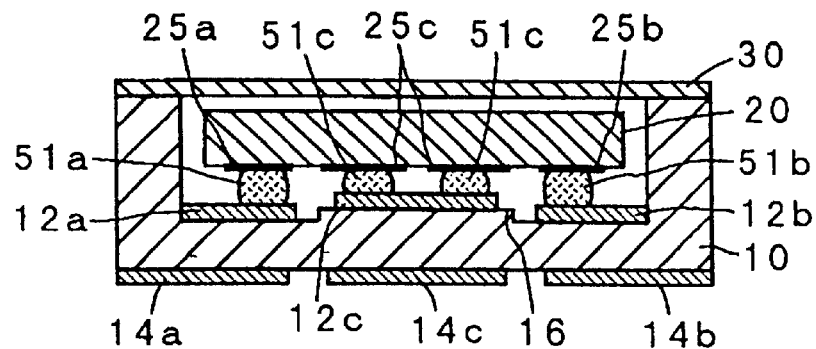
FIG. 3 is a sectional view of a surface acoustic wave device according to a second preferred embodiment of the present invention.

A surface acoustic wave device according to a second preferred embodiment will be described with reference to FIG. 3. In this preferred embodiment, a convex portion 16 is preferably formed in the base member 10 so that a portion for forming the electrode land for grounding 12c, that is the approximate central portion of the element mounting surface, projects toward the surface acoustic wave element 20. Each of electrode lands 12a to 12c preferably have substantially the same film thickness. The other structure is similar to that of the first preferred embodiment. That is, in the second preferred embodiment, a portion of the base member 10 has a greater thickness so that the top surface of the electrode land for grounding 12c is higher than the electrode lands for input-output 12a and 12b. As a result, the bumps 51a and 51b located along the peripheral portion of the surface acoustic wave element 20 have a greater height than that of the bumps 51c at the approximate central portion. As a result of this unique structure, the same advantages achieved by the first preferred embodiment are achieved in the second preferred embodiment.

Figure 4:
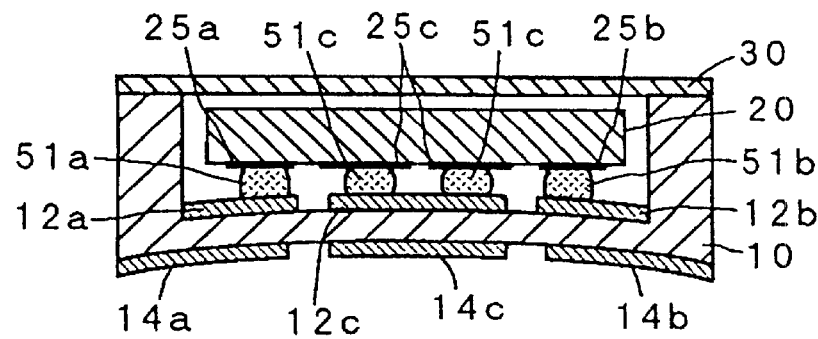
FIG. 4 is a sectional view of a surface acoustic wave device according to a third preferred embodiment of the present invention.

A surface acoustic wave device according to a third preferred embodiment will be described with reference to FIG. 4. In this preferred embodiment, the base member 10 is curved so that a forming portion of the electrode land for grounding 12c, that is the central portion of the element mounting surface, is close to the surface acoustic wave element 20. Each of electrode lands 12a to 12c preferably has the same film thickness. The other structure of this preferred embodiment is similar to that of the first preferred embodiment. That is, in the third preferred embodiment, the section of the base member 10 preferably has a roughly circularly curved surface so as to increase the height of the central portion of the element mounting surface, so that the top surface of the electrode land for grounding 12c higher than the electrode lands for input-output 12a and 12b. Thereby, the bumps 51a and 51b located along the peripheral portion of the surface acoustic wave element 20 have a greater height than that of the bumps 51c at the central portion.

Because of this unique structure and arrangement, the advantages achieved by the preferred embodiments described above are also achieved in the third preferred embodiment. The structure of the third preferred embodiment is simple in comparison to the structure of the first and second preferred embodiments, resulting in easy manufacturing.

Figure 5:
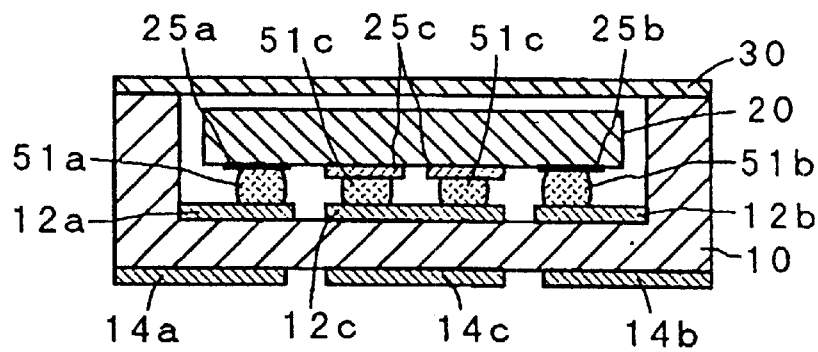
FIG. 5 is a sectional view of a surface acoustic wave device according to a fourth preferred embodiment of the present invention.

A surface acoustic wave device according to a fourth preferred embodiment will be described with reference to FIG. 5. In this fourth preferred embodiment, the films of the electrode pads for grounding 25c located at the approximate central portion of the surface acoustic wave element have a larger thickness than that of the electrode pads for input-output 25a and 25b located along the peripheral portion of the surface acoustic wave element. The electrode lands 12a to 12c of the base member 10 preferably have the same film thicknesses. The other structure of the fourth preferred embodiment is preferably similar to that of the first preferred embodiment. That is, in the fourth preferred embodiment, the bottom surfaces of the electrode pads for grounding 25c are lower than those of the electrode pads for input-output 25a and 25b. Thereby, the bumps 51a and 51b located along the peripheral portion of the surface acoustic wave element 20 have a larger height than that of the bumps 51c at the approximate central portion. Because of this unique structure and arrangement, the advantages achieved by the preferred embodiments described above are also achieved in the fourth preferred embodiment.

In addition, each of structures described in the above-mentioned preferred embodiments may be combined to form bumps located along the peripheral portion to have a greater height than that of bumps at the central portion.

Figure 6:
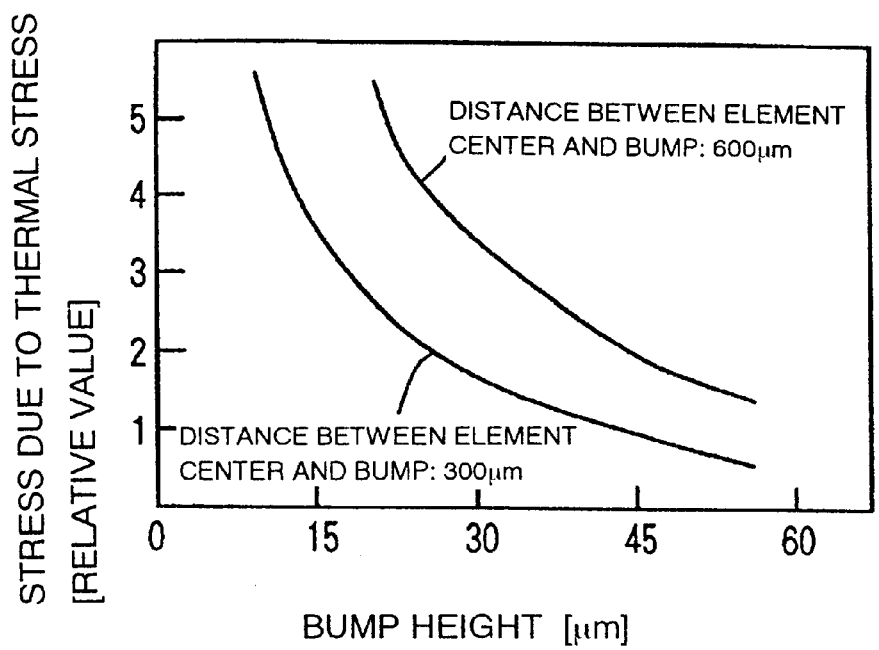
FIG. 6 is a graph showing the relationship between the height of bumps and stress caused by thermal stress.

FIG. 6 is a graph showing the relationship between the height of the bump and the stress imparted by thermal stress. In the example shown in FIG. 6, the stresses applied to the bumps are relatively shown when the height of the bump was changed, wherein the base member was formed of alumina, the bump had a diameter of about 120 $\mu$m, and two distances between the approximate center of the surface acoustic wave element and the bump of about 300 $\mu$m and about 600 $\mu$m were evaluated. In addition, as for the stress due to thermal stress, there is a stress produced when the temperature of joining such as bump bonding or joining of the base member to the case member is reduced to room temperature.

As shown in FIG. 6, the stress applied to the bump decreases with increasing height of the bump, and increases with increasing distance between the approximate center of the surface acoustic wave element and the bump. That is, the stress increases with increasing spacing between the bump forming position and the approximate center of the surface acoustic wave element. Therefore, when the height of bumps is the same, the stress applied to the bumps located along the peripheral portion is relatively larger than that of the bumps located at the approximate central portion.

Accordingly, in preferred embodiments of the present invention, the stress applied to the bumps located along the peripheral portion is greatly reduced such that the bumps located along the peripheral portion have a greater height than the bumps located in the approximate central portion. The reason is that the stress tends to be absorbed into the bump itself with increasing height of the bump.

That is, in each of preferred embodiments described above, the film thickness of the electrode land, the thickness of the convex portion, or the degree of the curvature in the base member or the film thickness of the electrode pad in the surface acoustic wave element is established such that each bump has a greater height in accordance with increasing distance from the approximate center of the surface acoustic wave element.

Figure 7:
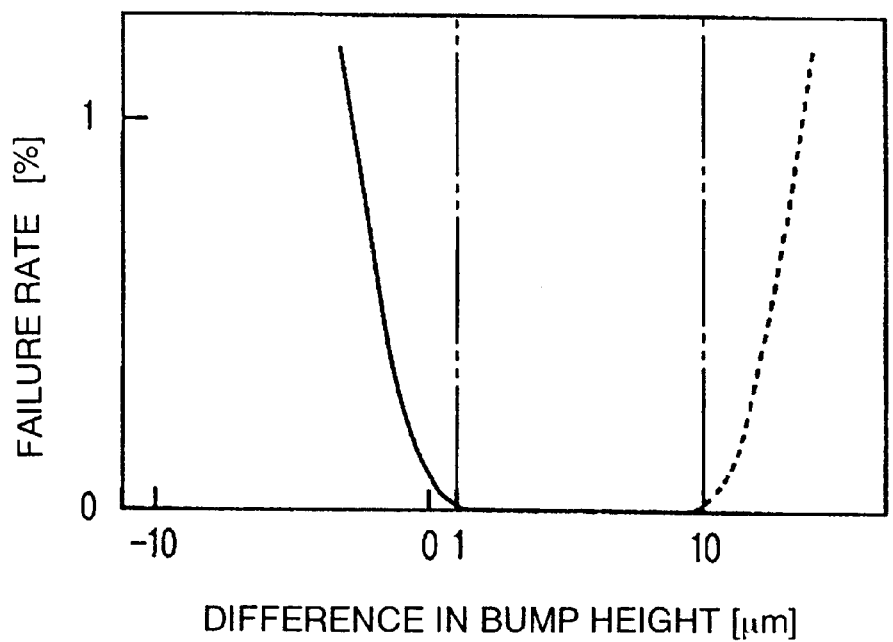
FIG. 7 is a graph showing the relationship between a difference in bump heights and the failure rate due to stress.
Figure 8:
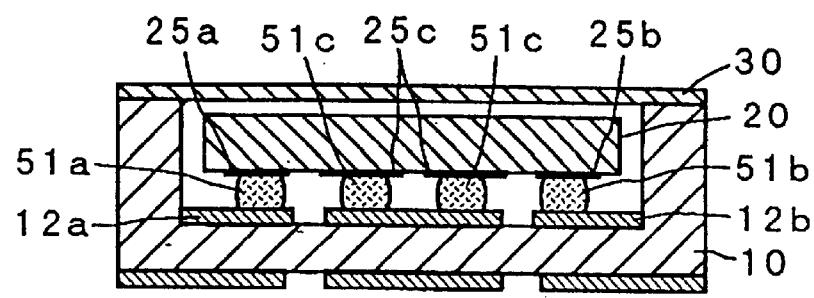
FIG. 8 is a sectional view of a conventional surface acoustic wave device.

Next, the difference in height of bumps will be considered. FIG. 7 is a graph showing the relationship between the difference in height between the bumps located along the peripheral portion and the bumps located in the approximate central portion and a failure rate due to the mechanical and the thermal stress. More particularly, in FIG. 7, the solid line indicates the failure by exfoliation of the electrode pads for input-output 25a and 25b shown in the respective drawings for the preferred embodiments due to the mechanical and the thermal stress while the broken line indicates the failure caused by insufficient bonding between the electrode lands for input-output 12a and 12b and the bumps 51a and 51b.

As shown in FIG. 7, when differences in height between the bumps located along the peripheral portion and the bumps located at the approximate central portion are substantially equal to or higher than about 1 $\mu$m, the failure due to the mechanical and the thermal stress is prevented. However, when differences in height between bumps are not less than about 10 $\mu$m, the bonding between bumps and electrode lands is deteriorated during assembling of the surface acoustic wave device, so that the failure caused by bonding problems such as insufficient bonding between the electrode land and the bump occur. Therefore, it is preferable that differences in height between the bumps range from about 1 $\mu$m to about 10 $\mu$m, while the bumps located along the peripheral portion have a larger height than the bumps located at the approximate central portion.

In addition, the electrode pattern is not limited to the one shown in FIG. 2. The surface acoustic wave element may have electrode patterns defined by one or no less than three IDTs. That is, the number and locations of electrode pads of the surface acoustic wave element and the number and locations of electrode lands of the base member are not limited to those in the above-mentioned preferred embodiments. Electrode pads and electrode lands for input-output may be located toward the approximate central portion, while electrode pads and electrode lands for grounding may be located along the peripheral portion.

The shapes of the base member and the cap member are not limited to those in the above-mentioned preferred embodiments. The package may be formed of a plate shaped base member and a recessed shaped cap member.

The above-mentioned preferred embodiments have been described in the context of the surface acoustic wave device. However, the present invention may be applied to a semiconductor device in which a semiconductor element is bump-bonded to a base member or to other electronic components.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An electronic component comprising:
   a base member having a plurality of electrode lands;
   an electronic component element having a substrate and a plurality of electrode pads provided on the substrate, the electronic component element being electrically and mechanically joined to the base member;
   a plurality of bumps located between the electronic component element and the base member, the plurality of electrode pads of the electronic component element and the corresponding electrode lands of the base member being respectively joined together via the bumps such that the electronic component is opposite to the base member; wherein
   the bumps located at the peripheral portion of the electronic component element have a greater height than that of the bumps located in the approximate central portion of the electronic component element; and
   at least one of the electrode lands and the electrode pads located at the approximate central portion of the electronic component element have a greater height than that of the at least one of the electrode lands and electrode pads located at the peripheral portion of the electronic component element.

2. An electronic component according to claim 1, wherein the electrode lands located at the approximate central portion of the base member have a greater height than that of the electrode lands located along the peripheral portion.

3. An electronic component according to claim 1, wherein the electrode pads located at the approximate central portion of the electronic component element have a greater height than that of the electrode pads located along the peripheral portion.

4. An electronic component according to claim 1, wherein the differences between heights of the bumps are about 1 μm to about 10 μm.

5. An electronic component according to claim 1, wherein the electronic component element is a surface acoustic wave element.

6. An electronic component according to claim 1, further comprising a cap member joined to the base member so as to cover the electronic component element and such that the electronic component element is hermetically sealed within a package defined by the base member and the cap member.

7. An electronic component according to claim 1, wherein the electrode lands are made of thick film electrodes of W or Mo and have Ni or Au plated thereon.

8. An electronic component according to claim 1, wherein the electrode pads are made of one of Al and an alloy including Al.

9. An electronic component according to claim 1, wherein the bumps are made of one of Au, a metal including Au as the main ingredient, and solder.

10. A method of manufacturing an electronic component, comprising the steps of:
    providing a base member having a plurality of electrode lands;
    providing an electronic component element having a substrate and a plurality of electrode pads provided on the substrate, the electronic component element being electrically and mechanically joined to the base member;
    forming a plurality of bumps on one of the base member and the electronic component element;
    arranging the electronic component element opposite to the base member; and
    joining the base member and the electronic component element via the plurality of bumps between the electronic component element and the base member, the plurality of electrode pads of the electronic component element and the corresponding electrode lands of the base member being respectively joined together via the bumps such that the electronic component element is opposite to the base member; wherein
    the step of forming the bumps includes forming the bumps located at the peripheral portion of the electronic component element to have a greater height than that of the bumps located in the approximate central portion of the electronic component element; and
    at least one of the steps of providing a base member and providing an electronic component element includes forming at least one of the electrode lands and the electrode pads located at the approximate central portion of the electronic component element to have a greater height than that of the at least one of the electrode lands and electrode pads located at the peripheral portion of the electronic component element.

11. The method according to claim 10, wherein the electrode lands located at the approximate central portion of the base member have a greater height than that of the electrode lands located along the peripheral portion.

12. The method according to claim 10, wherein the electrode pads located at the approximate central portion of the electronic component element have a greater height than that of the electrode pads located along the peripheral portion.

13. The method according to claim 10, wherein the differences between heights of the bumps are about 1 μm to about 10 μm.

14. The method according to claim 10, wherein the electronic component element is a surface acoustic wave element.

15. The method according to claim 10, further comprising applying at least one of heat and ultrasonic waves during the step of joining the base member and the electronic component element so as to fuse the bumps.

16. The method according to claim 10, further comprising forming the bumps on the electrode pads of the electronic component element via a ball bonding process.

* * * * *